(12) United States Patent
Ashida et al.

(10) Patent No.: US 11,791,073 B2
(45) Date of Patent: Oct. 17, 2023

(54) SHUNT RESISTOR

(71) Applicant: SUNCALL CORPORATION, Kyoto (JP)

(72) Inventors: Naoya Ashida, Kyoto (JP); Kenji Murakami, Kyoto (JP)

(73) Assignee: Suncall Corporation

( * ) Notice: Subject to any disclaimer, the term of this patent is extended or adjusted under 35 U.S.C. 154(b) by 85 days.

(21) Appl. No.: 17/480,982

(22) Filed: Sep. 21, 2021

(65) Prior Publication Data

US 2022/0037064 A1 Feb. 3, 2022

Related U.S. Application Data

(63) Continuation of application No. PCT/JP2020/011598, filed on Mar. 17, 2020.

(30) Foreign Application Priority Data

Apr. 17, 2019 (JP) .................................. 2019-078630

(51) Int. Cl.
*H01C 13/00* (2006.01)
(52) U.S. Cl.
CPC .................................... *H01C 13/00* (2013.01)
(58) Field of Classification Search
CPC .................................................... H01C 13/00
See application file for complete search history.

(56) References Cited

U.S. PATENT DOCUMENTS

| 3,245,021 | A | * | 4/1966 | Kernander | ............. | G01R 1/203 |
| | | | | | | 338/49 |
| 7,170,295 | B2 | * | 1/2007 | Hetzler | .................... | H01C 1/16 |
| | | | | | | 29/610.1 |
| 9,437,353 | B2 | * | 9/2016 | Hetzler | .................... | H01C 7/13 |
| 10,614,933 | B2 | * | 4/2020 | Endo | ..................... | H01C 13/00 |
| 11,488,750 | B2 | * | 11/2022 | Kobayakawa | ....... | H01C 17/245 |
| 11,555,831 | B2 | * | 1/2023 | Wyatt | ...................... | H01C 7/13 |
| 2014/0097933 | A1 | | 4/2014 | Yoshioka et al. | | |

FOREIGN PATENT DOCUMENTS

| JP | 551128 A | 1/1980 |
| JP | H173790 U | 5/1989 |
| JP | 2008082957 A | 4/2008 |
| JP | 2009244065 A | 10/2009 |
| JP | 2017212297 A | 11/2017 |
| WO | 2013005824 A1 | 1/2013 |
| WO | WO-2018229820 A1 * | 12/2018 |

* cited by examiner

*Primary Examiner* — Kyung S Lee
(74) *Attorney, Agent, or Firm* — St. Onge Steward Johnston & Reens LLC

(57) ABSTRACT

A shunt resistor the resistive value of which can be lowered simply and easily has: a first resistive body, two base materials that sandwich the first resistive body therebetween and are joined by a welding to the first resistive body, and a second resistive body joined by a welding to the two base materials at different positions from the first resistive body. In addition, the second resistive body can come into contact with the first resistive body.

2 Claims, 7 Drawing Sheets

SHUNT RESISTOR

FIELD OF THE INVENTION

The present invention relates to a shunt resistor.

BACKGROUND OF THE INVENTION

A shunt resistor as described in Japanese unexamined patent application publication No. 2009-244065 is known as a conventional shunt resistor. As shown in FIG. 7, the conventional shunt resistor 100 includes two plate-like base materials 102 sandwiching a resistive body 101 therebetween and joined to the resistive body 101 by welding 101a the resistive body 101 and a measurement terminal portion 103 joined to each of the base materials 102 by welding 103a. Reference sign 102a denotes a circular bolt hole for passing a shaft portion of a bolt (not shown).

SUMMARY OF THE INVENTION

Incidentally, when a current flows through the shunt resistor 100 as described above, the resistive body 101 generates heat, and the resistance value of the resistive body 101 changes depending on the heat generation temperature. Therefore, the resistance value of the resistive body 101 needs to be lowered so as not to raise the heat generation temperature. For example, the resistance value of the resistive body 101 is preferably about 100μΩ when a large current of 400 A flows through the shunt resistor 100. The resistance value of the resistive body 101 is preferably about 30μΩ to 50μΩ when a large current of 1000 A flows through the shunt resistor 100.

Accordingly, in order to lower the resistance value of the resistive body 101, it is conceivable to narrow the width W10 (see FIG. 7(b)) of the resistive body 101. For example, the width W10 (see FIG. 7(b)) of the resistive body 101 needs to be about 8 mm in order to set the resistance value of the resistive body 101 to 100μΩ, and the width W10 (see FIG. 7(b)) of the resistive body 101 needs to be about 3 mm in order to set the resistance value of the resistive body 101 to 30μΩ to 50μΩ.

However, there has been a problem that when the width W10 (see FIG. 7(b)) of the resistive body 101 is narrowed as described above, it is very difficult to join the resistive body 101 and the two base materials 102 by welding 101a the resistive body 101 with the resistive body 101 sandwiched between the two base materials 102. Therefore, there has been a problem that it is very difficult to lower the resistance value.

On the other hand, it is known that the resistance value of the resistive body 101 changes depending on the volume of the resistive body 101 itself. Accordingly, a method is generally known that a notch 101b formed in a concaved shape is provided to the resistive body 101 as shown in FIG. 7 to reduce the volume of the resistive body 101 itself, thereby adjusting the resistance value of the resistive body 101.

However, while the method as described above can increase the resistance value the resistance value cannot be lowered. Therefore, there has been a problem that the resistance value cannot be lowered by this method as well.

Accordingly, in view of the foregoing problems, an object of the present invention is to provide a shunt resistor whose resistance value can be lowered simply and easily.

The foregoing object of the present invention is achieved by the following means. It is noted that reference signs of embodiments to be described later are added in parentheses, but the present invention is not limited thereto.

According to the first aspect of the present invention, a shunt resistor is characterized by including a first resistive body (10), two base materials (11) sandwiching the first resistive body (10) therebetween and joined to the first resistive body (10) by welding (Y1), and a second resistive body (12, 12B, 12C, 12D) joined to the two base materials (11) by welding (Y2, Y2B, Y2C, Y2D) at a position different from the first resistive body (10).

Further, according to the second aspect of the present invention, the shunt resistor according to the above first aspect is characterized in that the second resistive body (12, 12B, 12C) comes in contact with the first resistive body (10) and is joined to the two base materials (11) by welding (Y2, Y2B, Y2C).

On the other hand, according to the third aspect of the present invention, the shunt resistor according to the above first aspect is characterized in that the second resistive body (12D) is joined to the two base materials (11) by welding (Y2D) at a position adjacent to the first resistive body (10) and in a non-contact manner with the first resistive body (10).

Next, advantageous effects of the present invention will be described with reference signs in the drawings. It is noted that reference signs in the embodiments to be described later are added in parentheses, but the present invention is not limited thereto.

According to the first aspect of the present invention, a joining area of the resistive bodies (the first resistive body 10 and the second resistive body 12, 12B, 12C, 12D) joined to the two base materials (11) is increased by joining the second resistive body (12, 12B, 12C, 12D) by welding (Y2, Y2B, Y2C, Y2D) to the two base materials (11) sandwiching the first resistive body (10) therebetween and joined to the first resistive body (10) by welding (Y1), at a position different from the first resistive body (10). This makes it possible to lower the resistance value.

Thus, according to the present invention, the resistance value can be lowered only by joining the second resistive body (12, 12B, 12C, 12D) to the two base materials (11) by welding (Y2, Y2B, Y2C, Y2D) at a position different from the first resistive body (10), so that the resistance value can be lowered simply and easily.

Further, when the second resistive body (12, 12B, 12C, 12D) is joined to the two base materials (11) by welding (Y2, Y2B, Y2C, Y2D), it is preferable to bring the second resistive body (12, 12B, 12C) into contact with the first resistive body (10) and join the second resistive body (12, 12B, 12C) to the two base materials (11) by welding (Y2, Y2B, Y2C) as in the second aspect of the present invention. Alternatively, as in the third aspect of the present invention, it is preferable to join the second resistive body (12D) to the two base materials (11) by welding (Y2D) at a position adjacent to the first resistive body (10) and in a non-contact manner with the first resistive body (10).

DETAILED DESCRIPTION OF THE INVENTION

Hereinafter, an embodiment of a shunt resistor according to the present invention will be specifically described with reference to the drawings. It is noted that, in the following description, when vertical and horizontal directions are indicated, it shall mean vertical and horizontal directions when viewed from the front of the figure.

Figure 1A:
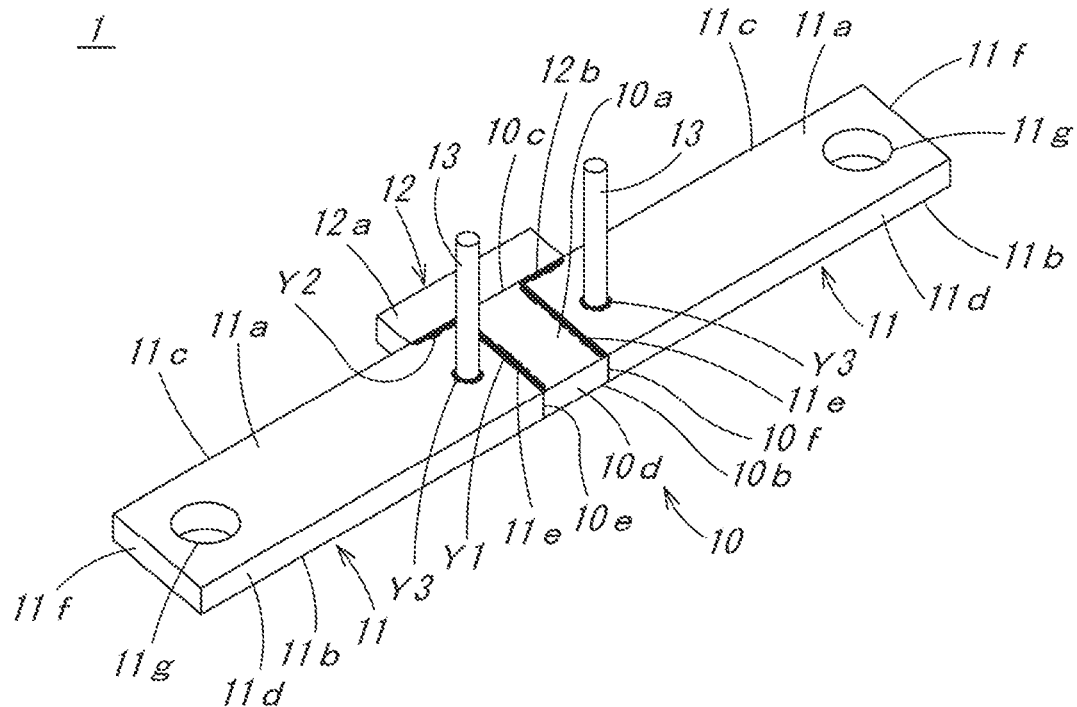
FIG. 1(a) is a perspective view of a shunt resistor according to an embodiment of the present invention and FIG. 1(b) is a plan view of the shunt resistor according to the same embodiment.

A shunt resistor according to the present embodiment is used in measuring the current value of a current path through which a large current flows from a battery for high-voltage applications or an inverter to a motor circuit that are used in, for example, electric vehicles (EVs), hybrid vehicles (HVs), and plug-in hybrid vehicles (PHVs). As shown in FIG. 1, the shunt resistor 1 is composed of a first resistive body 10, two base materials 11 sandwiching the first resistive body 10 therebetween and integrally formed with the first resistive body 10 by welding Y1, a second resistive body 12 joined to the two base materials 11 by welding Y2 at a position different from the first resistive body 10, and a measurement terminal 13 erected and fixed by welding Y3 on each of upper surfaces 11a of the two base materials 11.

Figure 1B:
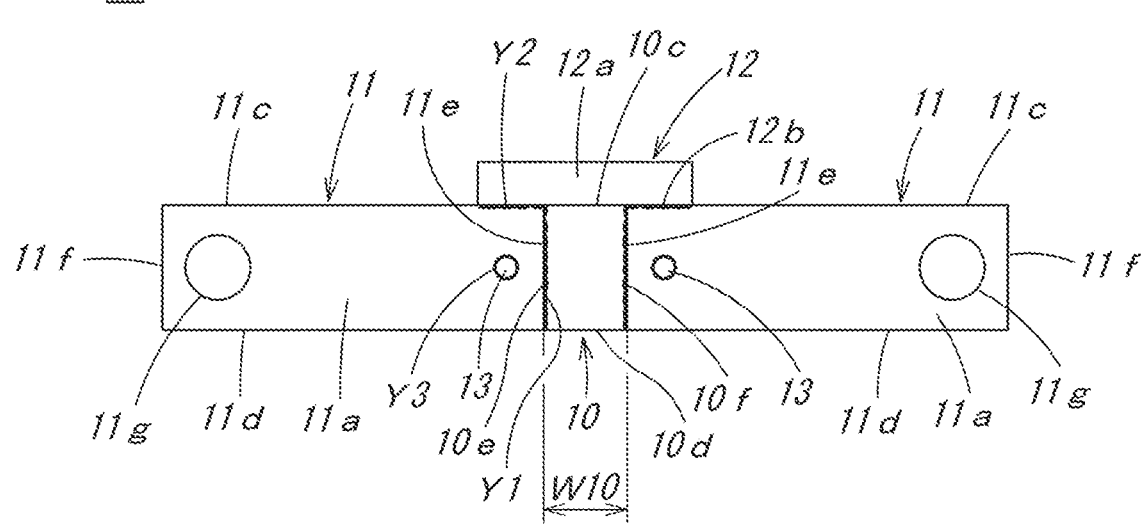
Figure 7A:
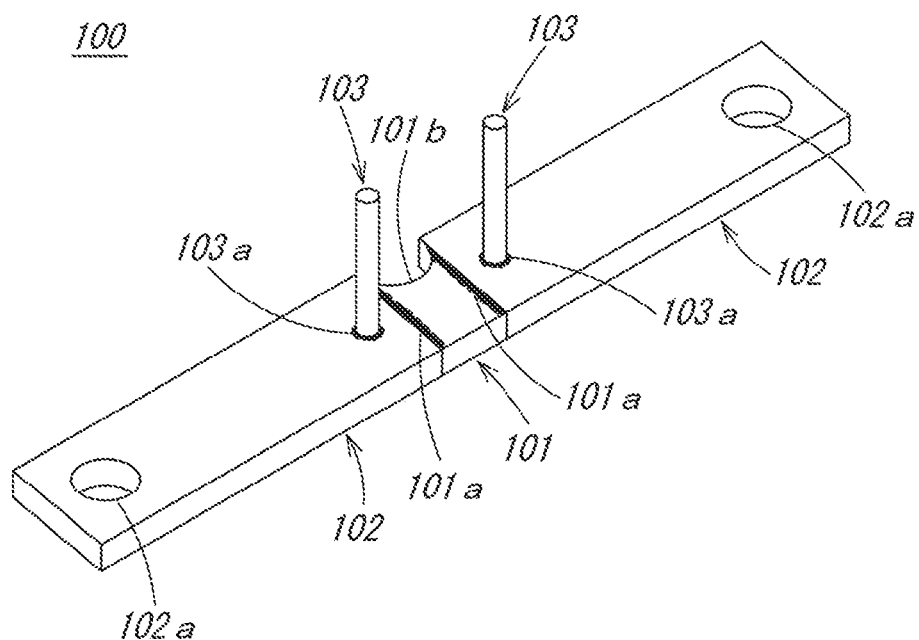
FIG. 7(a) is a perspective view of a conventional (prior art) shunt resistor and FIG. 7(b) is a plan view of the conventional shunt resistor.
Figure 7B:
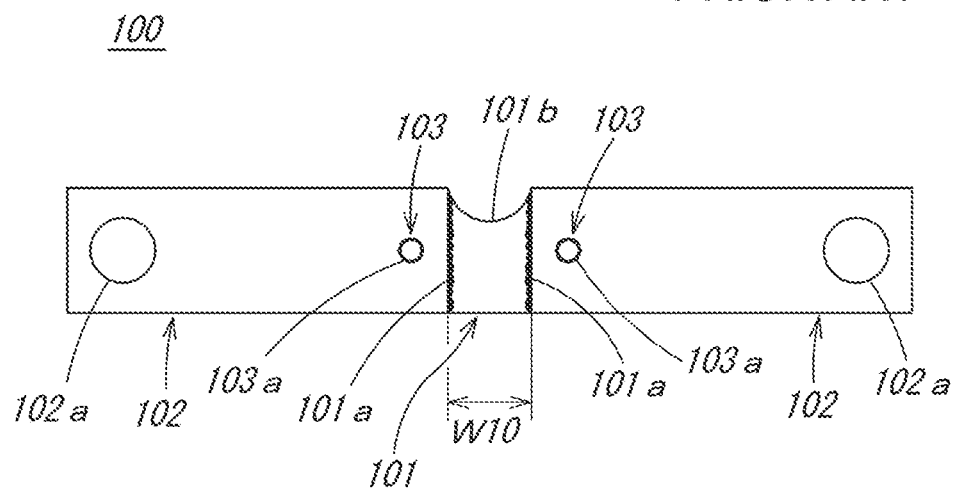

The first resistive body 10 is the same as a resistive body 101 shown in FIG. 7, and as shown in FIG. 1(b), is formed, for example, in a thick plate shape having a thickness of 3 mm to 5 mm and in a short rectangular shape consisting of an upper surface 10a, a lower surface 10b, an upper side surface 10c, a lower side surface 10d, a left side surface 10e, and a right side surface 10f, and is formed with the same width W10 as the width W10 shown in FIG. 7(b). Further, the first resistive body 10 is formed of, for example, a Cu—Mn-based alloy, a Cu—Ni-based alloy, or a Ni—Cr-based alloy.

As shown in FIG. 1, in the first resistive body 10 thus formed, the base material 11 located on the left side in the figure is joined to the left side surface 10e of the first resistive body 10 by welding Y1 and the base material 11 located on the right side in the figure is joined to the right side surface 10f of the first resistive body 10 by welding Y1. As a result, the pair of base materials 11 are integrally formed with the first resistive body 10 in a manner of sandwiching the first resistive body 10 therebetween.

The base material 11 is the same as a base material 102 shown in FIG. 7 and is a so-called bus bar. The base material 11 is formed of metal such as copper, and as shown in FIG. 1, is formed, for example, in a thick plate shape having a thickness of about 3 mm to 5 mm and in a long rectangular shape consisting of the upper surface 11a, a lower surface 11b, an upper side surface 11c, a lower side surface 11d, one side surface 11e, and the other side surface 11f. A circular bolt hole 11g for passing a shaft portion of a bolt (not shown) is formed vertically penetratingly on the other side surface 11f side (the side opposite to the joint part of the first resistive body 10) along the width direction of the base material 11.

Thus, as shown in FIG. 1, in the base materials 11 thus formed, one side surface 11e of the base material 11 located on the left side of the figure is joined to the left side surface 10e of the first resistive body 10 by welding Y1, and one side surface 11e of the base material 11 located on the right side of the figure is joined to the right side surface 10f of the first resistive body 10 by welding Y1. As a result, the pair of base materials 11 and the first resistive body 10 are integrally formed by welding Y1.

As shown in FIG. 1, the second resistive body 12 is formed, for example, in a thick plate shape having a thickness of about 3 mm to 5 mm and in a short rectangular shape, and is formed of, for example, a Cu—Mn-based alloy, a Cu—Ni-based alloy, or a Ni—Cr-based alloy.

Thus, as shown in FIG. 1(b), in the second resistive body 12 thus formed, a lower side surface 12b of the second resistive body 12 is joined to the upper side surfaces 11c of the pair of base materials 11 by welding Y2 so that an upper surface 12a of the second resistive body 12 and the upper surface 10a of the first resistive body 10 are flush with each other and the lower side surface 12b of the second resistive body 12 and the upper side surface 10c of the first resistive body 10 come in contact with each other. As a result, the pair of base materials 11 and the second resistive body 12 are integrally formed by welding Y2.

The measurement terminal 13 is the same as a measurement terminal portion 103 shown in FIG. 7 and is capable of mounting thereon a printed circuit board for current detection. The measurement terminal 13 is formed of, for example, copper or tin plating, and as shown in FIG. 1, is erected and fixed on each of the two base materials 11 by welding Y3.

Thus, according to the present embodiment described above, the joining area of the resistive bodies (the first resistive body 10 and the second resistive body 12) joined to the two base materials 11 is increased by joining the second resistive body 12 by welding Y2 to the two base materials 11 sandwiching the first resistive body 10 therebetween and integrally formed with the first resistive body 10 by welding Y1, at a position different from the first resistive body 10. This makes it possible to lower the resistance value.

That is, when the current value of a current path through which a large current flows from a battery for high-voltage applications or an inverter to a motor circuit is measured, the current flows through the two base materials 11. When the joining area of the resistive bodies (the first resistive body 10 and the second resistive body 12) increases, the current path increases accordingly. Thus, when the current path increases, the current flowing through the resistive bodies (the first resistive body 10 and the second resistive body 12) flows easier as compared with the conventional case, and the heat generation temperature of the resistive bodies (the first resistive body 10 and the second resistive body 12) can be made lower than before. This makes it possible to lower the resistance value.

Thus, according to the present embodiment, the resistance value can be lowered only by joining the second resistive body 12 to the two base materials 11 by welding Y2 at a position different from the first resistive body 10 without narrowing the width W10 (see FIG. 1(b)) of the first resistive body 10, that is, in the same width W10 (see FIG. 1(b) and FIG. 7(b)) as the conventional one. Therefore, the resistance value can be lowered simply and easily.

Further, according to the present embodiment, when the resistance value is to be increased in adjusting the resistance value, the resistance value is simply required to be increased by using the method as shown in FIG. 7 and providing the first resistive body 10 and/or the second resistive body 12 with a concave-shaped notch to reduce the volume of the first resistive body 10 and/or the second resistive body 12 themselves/itself. On the other hand, when the resistance value is to be lowered, a new second resistive body having a large area, such as making it longer than the second resistive body 12, is simply required to be joined to the two base materials 11 by welding Y2.

Thus, according to the present embodiment, the resistance value can be adjusted simply and easily.

Further, when the resistance value is lowered, the heat generation temperature of the resistive bodies (the first resistive body 10 and the second resistive body 12) can be made lower than before. Thus, the heat generation loss can be reduced.

Further, when the printed circuit board for current detection is mounted on the measurement terminal 13, a heat radiation fin is required. However, when the resistance value is lowered, the heat generation temperature of the resistive bodies (the first resistive body 10 and the second resistive body 12) can be made lower than before, so that the heat radiation fin can be made compact or unnecessary.

Incidentally, the shape of the shunt resistor 1 shown in the present embodiment is merely an example, and various modifications and changes can be made within the scope of the gist of the present invention described in the claims. For example, the example in which the first resistive body 10 and the second resistive body 12 are provided separately is shown in the present embodiment, but without being limited thereto, they may be integrated. However, it is preferable to provide them separately because only the second resistive body 12 is simply required to be changed when the resistance value is to be lowered in adjusting the resistance value.

Figure 2:
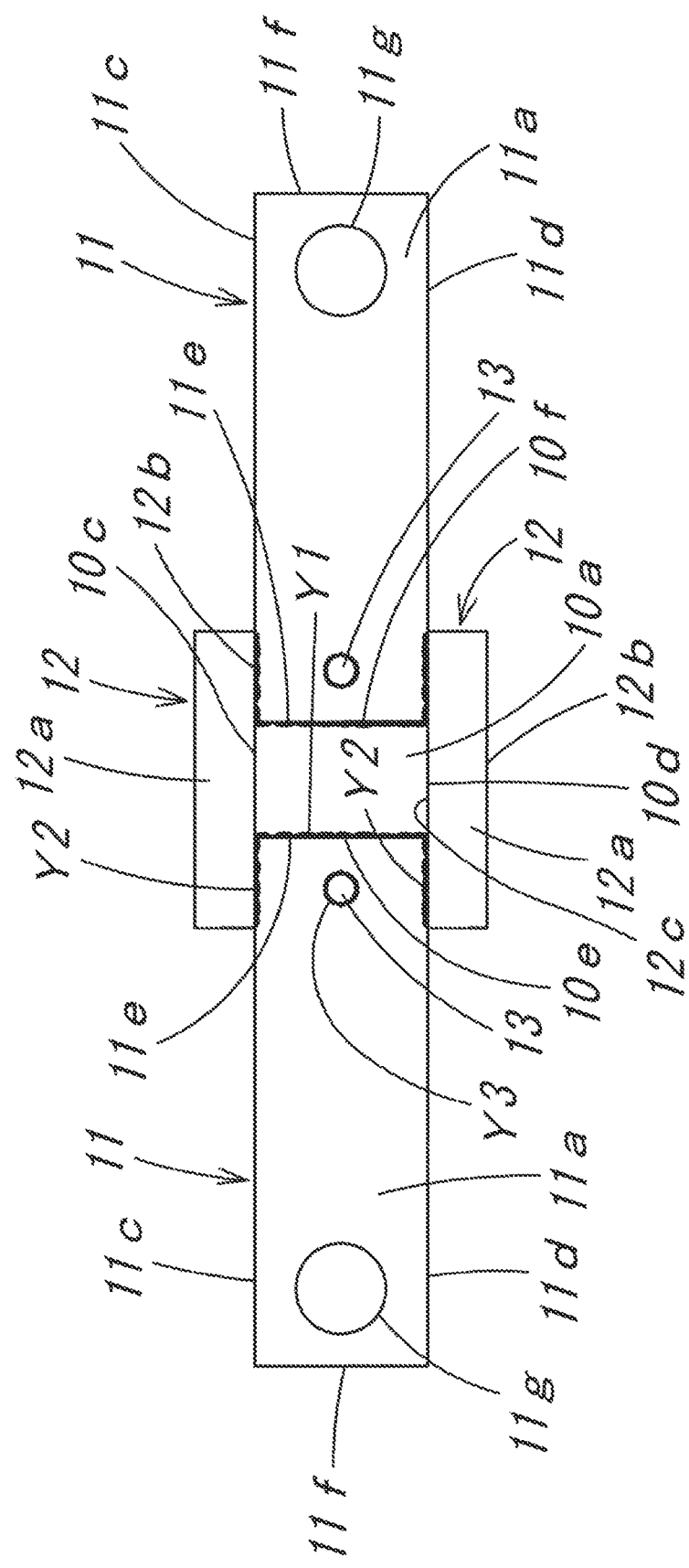
FIG. 2 is a plan view of a shunt resistor according to another embodiment.

On the other hand, the shape of the second resistive body 12 may be any shape, and the position of the joint to the two base materials 11 is not limited to that shown in FIG. 1 and may be any position. For example, a shunt resistor 1A as shown in FIG. 2 may be used. This point will be specifically described with reference to FIG. 2. The same configurations as those of the shunt resistor 1 shown in FIG. 1 are denoted by the same reference signs and their detailed description will be omitted.

The difference between the shunt resistor 1A shown in FIG. 2 and the shunt resistor 1 shown in FIG. 1 is only that another second resistive body 12 is newly joined, while all else is the same. That is, as shown in FIG. 2, another second resistive body 12 is joined to the pair of base materials 11 by joining an upper side surface 12c of the second resistive body 12 to the lower side surfaces 11d of the pair of base materials 11 by welding Y2 so that an upper surface 12a of the second resistive body 12 and the upper surface 10a of the first resistive body 10 are flush with each other and the upper side surface 12c of the second resistive body 12 and the lower side surface 10d of the first resistive body 10 come in contact with each other. As a result, the pair of base materials 11 and the pair of second resistive bodies 12 are integrally formed by welding Y2.

Thus, in this manner as well, the current path increases, and the current flowing through the resistive bodies (the first resistive body 10 and the second resistive body 12) flows easier as compared with the conventional case. Accordingly, the heat generation temperature of the resistive bodies (the first resistive body 10 and the second resistive body 12) can be made lower than before, and the resistance value can be lowered. When the resistance value is to be lowered in adjusting the resistance value, another resistive body 12 may be newly joined to the two base materials 11 by welding Y2 as shown in FIG. 2, instead of replacing the second resistive body 12 itself.

Figure 3:
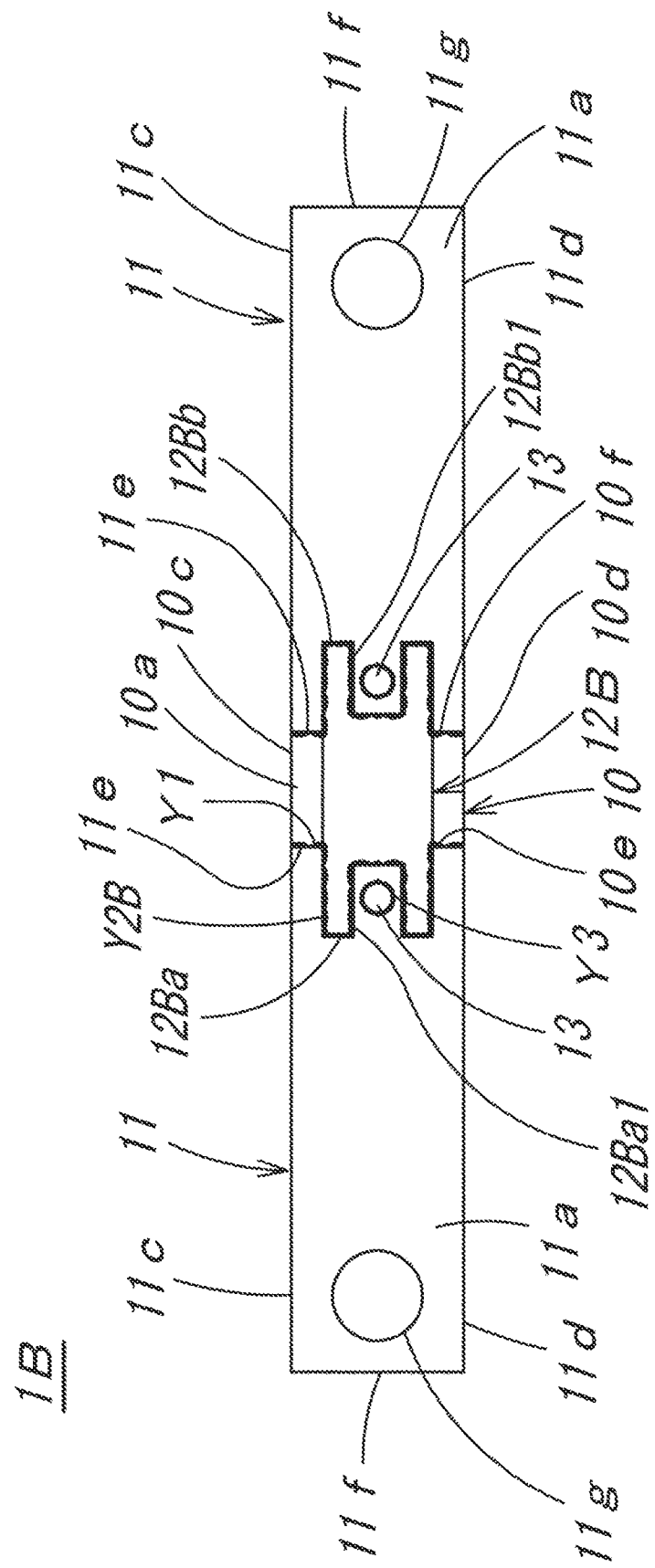
FIG. 3 is a plan view of a shunt resistor according to still another embodiment.

Further, a shunt resistor 1B shown in FIG. 3 may be used. This point will be specifically described with reference to FIG. 3. The same configurations as those of the shunt resistor 1 shown in FIG. 1 are denoted by the same reference signs and their detailed description will be omitted.

The difference between the shunt resistor 1B shown in FIG. 3 and the shunt resistor 1 shown in FIG. 1 is only that the shape of the second resistive body and the joint position are different, while all else is the same. That is, as shown in FIG. 3, a second resistive body 12B is formed in a substantially rectangular shape in plan view, a first notch 12Ba1 having a leftward U shape in plan view is provided on a left side surface 12Ba side, and a second notch 12Bb1 having a rightward U shape in plan view is provided on a right side surface 12Bb side. The second resistive body 12B thus formed is placed on the upper surface 10a of the first resistive body 10 so as to be orthogonal to the first resistive body 10, and parts thereof in contact with the pair of base materials 11 (the left side surface 12Ba side and the right side surface 12Bb side of the second resistive body 12B) are joined by welding Y2B. As a result, the pair of base materials 11 and the second resistive body 12B are integrally formed by welding Y2B. At this time, the pair of measurement terminals 13 are positioned in the first notch 12Ba1 and the second notch 12Bb1 respectively so as to prevent the possibility that the second resistive body 12B and the measurement terminals 13 come in contact and the measurement terminals 13 measure an erroneous current value.

Thus, in this manner as well, the current path increases and the current flowing through the resistive bodies (the first resistive body 10 and the second resistive body 12B) flows easier as compared with the conventional case. Therefore, the heat generation temperature of the resistive bodies (the first resistive body 10 and the second resistive body 12B) can be made lower than before and the resistance value can be lowered.

Figure 4:
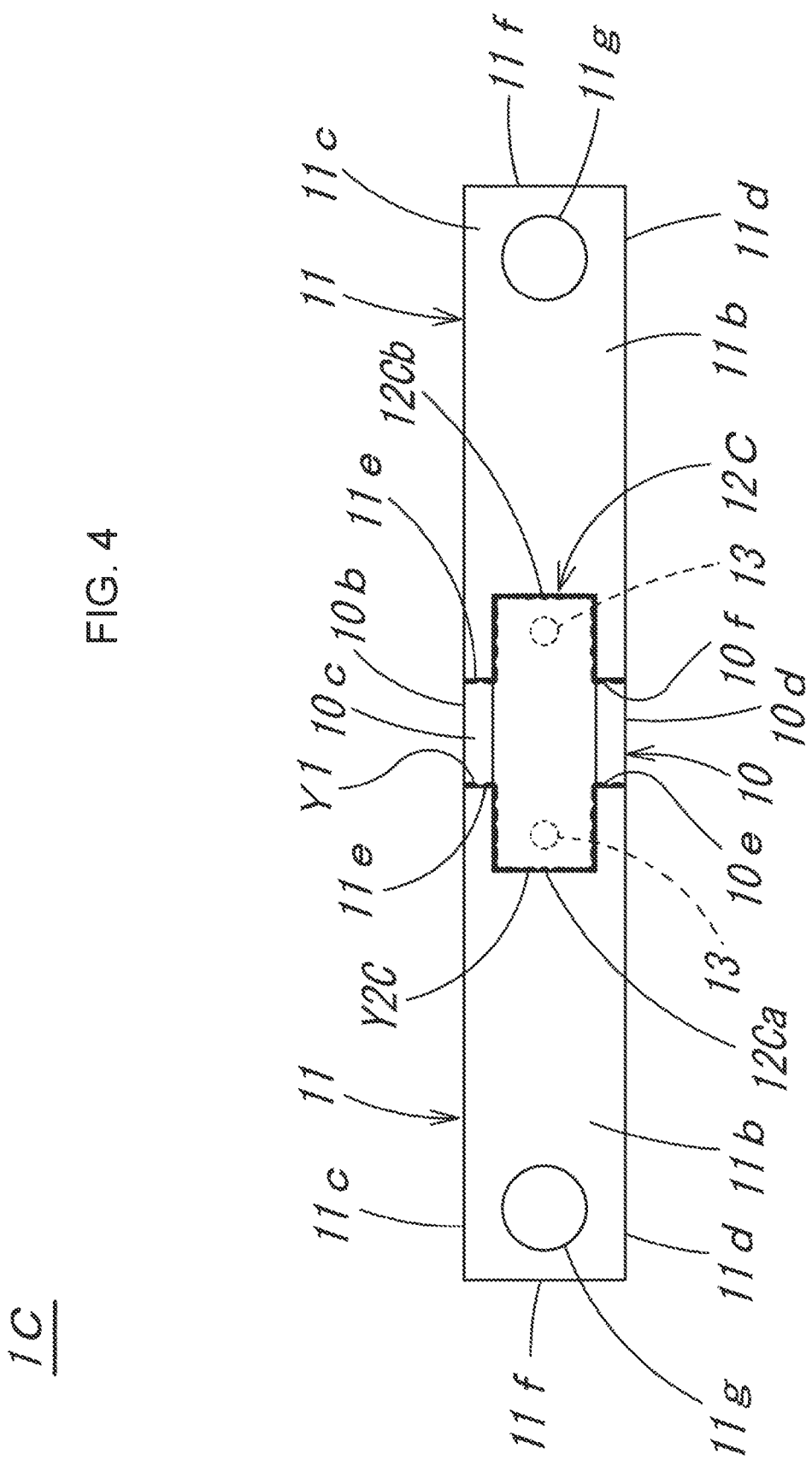
FIG. 4 is a bottom view of a shunt resistor according to further another embodiment.

On the other hand, a shunt resistor 1C as shown in FIG. 4 can be used. This point will be specifically described with reference to FIG. 4. The same configurations as those of the shunt resistor 1 shown in FIG. 1 are denoted by the same reference signs and their detailed description will be omitted.

The difference between the shunt resistor 1C shown in FIG. 4 and the shunt resistor 1 shown in FIG. 1 is only that the shape of the second resistive body and the joint position are different, while all else is the same. That is, as shown in FIG. 4, a second resistive body 12C is formed in a substantially rectangular shape in plan view. The second resistive body 12C thus formed is placed on the lower surface 10b of the first resistive body 10 so as to be orthogonal to the first resistive body 10, and parts thereof in contact with the pair of base materials 11 (a left side surface 12Ca side and a right side surface 12Cb side of the second resistive body 12C) are joined by welding Y2C. As a result, the pair of base materials 11 and the second resistive body 12C are integrally formed by welding Y2C.

Thus, in this manner as well, the current path increases and the current flowing through the resistive bodies (the first resistive body 10 and the second resistive body 12C) flows easier as compared with the conventional case. Therefore, the heat generation temperature of the resistive bodies (the first resistive body 10 and the second resistive body 12C) can be made lower than before and the resistance value can be lowered.

Incidentally, in any of the shunt resistor 1 shown in FIG. 1, the shunt resistor 1A shown in FIG. 2, the shunt resistor 1B shown in FIG. 3, and the shunt resistor 1C shown in FIG. 4, the example in which the first resistive body 10 and the second resistive body 12, 12B, 12C are in contact with each other is shown. However, they do not have to be in contact with each other as shown in a shunt resistor 1D shown in FIG. 5. This point will be specifically described with reference to FIG. 5. The same configurations as those of the shunt resistor 1 shown in FIG. 1 are denoted by the same reference signs and their detailed description will be omitted.

Figure 5:
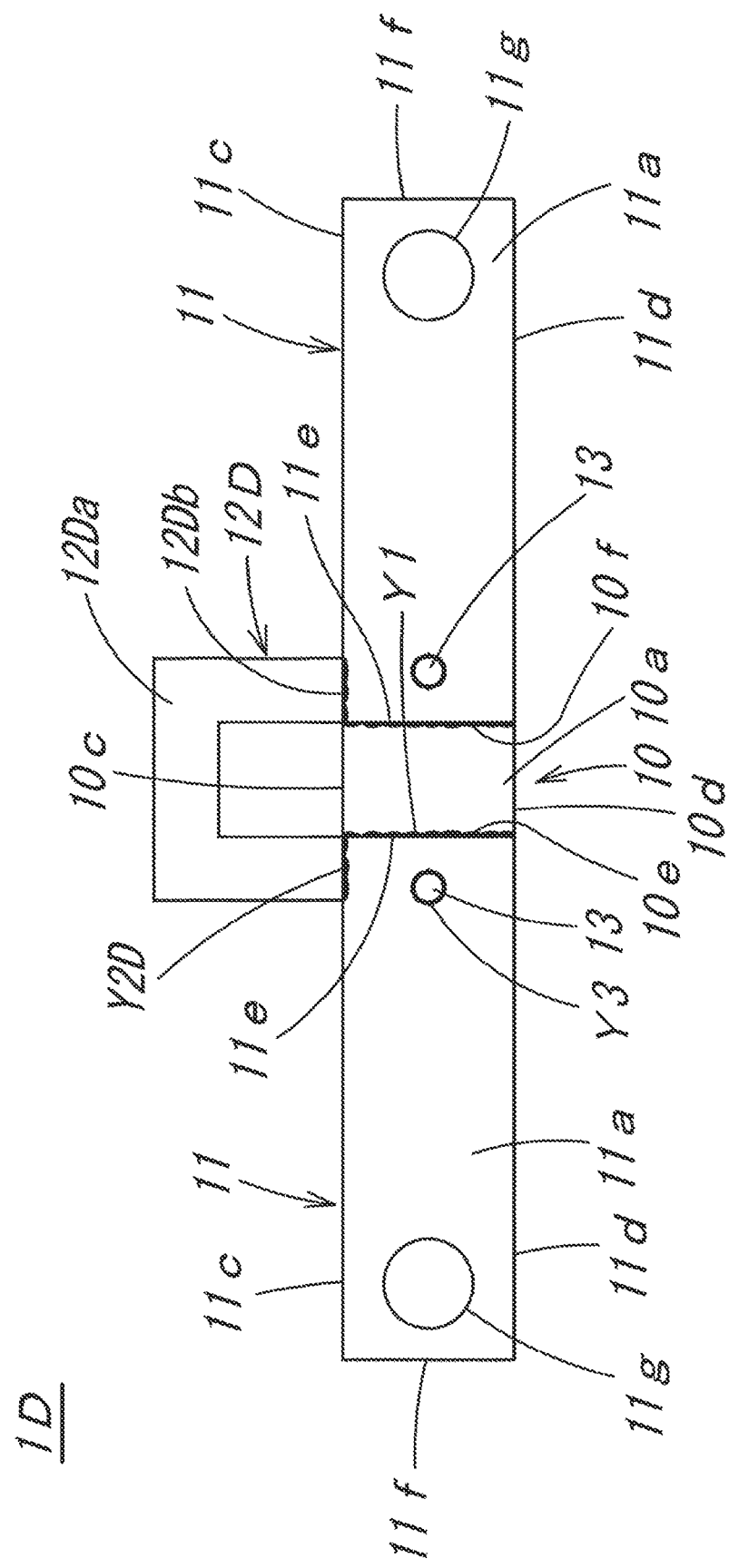
FIG. 5 is a plan view of a shunt resistor according to still further another embodiment.

The difference between the shunt resistor 1D shown in FIG. 5 and the shunt resistor 1 shown in FIG. 1 is only that the shape of the second resistive body and the joint position are different, while all else is the same. That is, as shown in FIG. 5, a second resistive body 12D is formed in a downward U shape in plan view, has an upper surface 12Da thereof flush with the upper surfaces 11a of the pair of base materials 11 and has a lower side surface 12Db thereof joined to the upper side surfaces 11c of the pair of base materials 11 by welding Y2D. As a result, the pair of base materials 11 and the second resistive body 12D are integrally formed by welding Y2D. At this time, the first resistive body 10 and the second resistive body 12D are located on adjacent positions but are in a non-contact state.

Thus, in this manner as well, the current path increases and the current flowing through the resistive bodies (the first resistive body 10 and the second resistive body 12D) flows easier as compared with the conventional case. Therefore, the heat generation temperature of the resistive bodies (the first resistive body 10 and the second resistive body 12D) can be made lower than before and the resistance value can be lowered.

The shunt resistors 1, 1A, 1B, 1C, 1D exemplified above can be applied also as a shunt resistor for a fuse requiring low resistance.

Next, the present invention will be described in more detail using an example.

10 shunt resistors 1 shown in FIG. 1 and 10 conventional shunt resistors were used to measure the resistance value.

Figure 6:
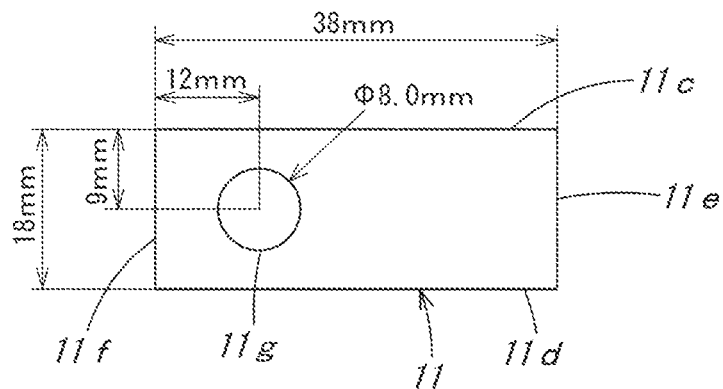
FIG. 6(a) is a plan view of a base material according to an example.
FIG. 6(b) is a plan view of a first resistive body and a second resistive body according to the example.
FIG. 6(c) is a plan view showing experimental conditions of a shunt resistor according to the example.
Figure 6:
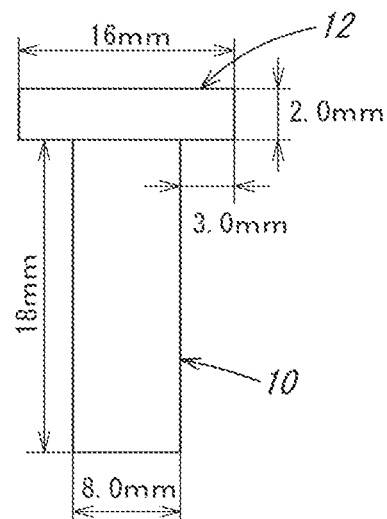
Figure 6:
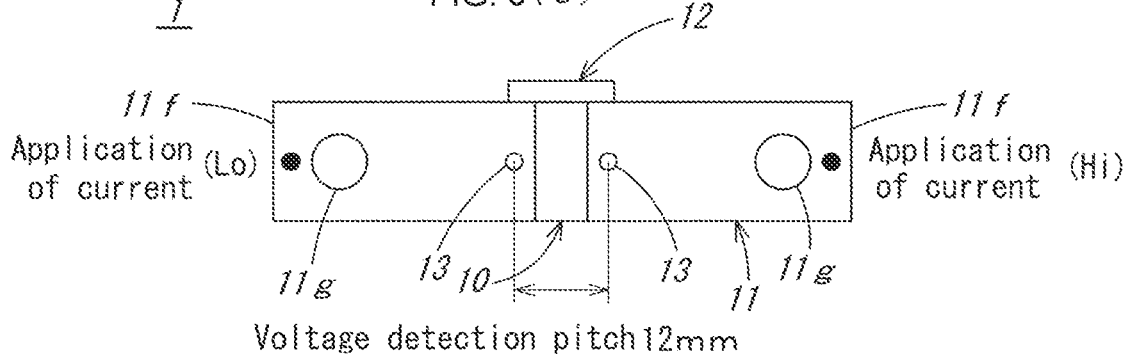

As the size of the shunt resistor 1, as shown in FIG. 6(a), a base material 11 was used in which the width of the base material 11 (distance from the other side surface 11f to one side surface 11e of the base material 11) was 38 mm, the height of the base material 11 (distance from the upper side surface 11c to the lower side surface 11d of the base material 11) was 18 mm, the distance from the upper side surface 11c of the base material 11 to the center point of the bolt hole 11g of the base material 11 was 9 mm, the distance from the other side surface 11f of the base material 11 to the center point of the bolt hole 11g of the base material 11 was 12 mm, the diameter of the bolt hole 11g of the base material 11 was 8.0 mm, and the thickness was 3.0 mm.

Further, a first resistive body 10 having a width of 8.0 mm, a height of 18 mm, and a thickness of 2.0 mm was used as shown in FIG. 6(b). A second resistive body 12 having a width of 16 mm, a height of 2.0 mm, and a thickness of 2.0 mm was used as shown in FIG. 6(b).

It is noted that the conventional shunt resistor is only not provided with the second resistive body 12, while all else is the same as the base material 11 and the first resistive body 10.

With respect to the shunt resistor 1 formed in such a size, as shown in FIG. 6(c), a current was applied to the other side surface 11f side (see black circle in the figure) of the base material 11 so that the current flew from the right side to the left side in the figure, and the measurement terminals 13 were arranged so that the voltage detection pitch was 12 mm. The conventional shunt resistors were also tested under the same conditions.

Under such conditions, the shunt resistors 1 and the conventional resistors were each placed on a resistance measuring jig manufactured by SUNCALL CORPORATION, and the resistance value was measured using a resistance measuring instrument, RM3543 RESISTANCE HiTESTER, manufactured by HIOKI E.E. CORPORATION. The results are shown in Table 1.

TABLE 1

| | Resistance value (mΩ) | |
|---|---|---|
| No. | Example | Comparative Example (Conventional) |
| 1 | 0.08432 | 0.09912 |
| 2 | 0.08423 | 0.09935 |
| 3 | 0.08501 | 0.09972 |
| 4 | 0.08458 | 0.09943 |
| 5 | 0.08425 | 0.09978 |
| 6 | 0.08448 | 0.09929 |
| 7 | 0.08405 | 0.09937 |
| 8 | 0.08443 | 0.09962 |
| 9 | 0.08477 | 0.09955 |
| 10 | 0.08457 | 0.09971 |

As shown in the results of Table 1 above, it can be seen that the resistance values of the shunt resistors 1 are all lower than those of the conventional shunt resistors. Further, the average value of the resistance values of the conventional shunt resistors is 0.09949 mΩ, whereas the average value of the resistance values of the shunt resistors 1 is 0.08446 mΩ. From this, it can be seen that the shunt resistor 1 has the resistance value about 15% lower than that of the conventional shunt resistor.

Then, it was found that the resistance value can be lowered when the shunt resistor according to the present embodiment is used. Thus, according to the present embodiment, the resistance value can be lowered simply and easily.

What is claimed is:

1. A shunt resistor comprising:
a first resistive body, and the first resistive body being rectangular;
two base materials sandwiching the first resistive body therebetween and joined to the first resistive body by welding, and the two base materials being rectangular;
a second resistive body joined to the two base materials by welding at a position different from the first resistive body, and the second resistive body being rectangular; and
a lower side surface of the second resistive body is joined to an upper side surfaces of the two base materials by welding so that an upper surface of the first resistive body and an upper surface of the second resistive body are flush with each other and the lower side surface of the second resistive body and an upper side surface of the first resistive body come in contact with each other, or
an upper side surface of the second resistive body is joined to lower side surfaces of the two base materials by welding so that the upper surface of the first resistive body and the upper surface of the second resistive body are flush with each other and the upper side surface of the second resistive body and a lower side surface of the first resistive body come in contact with each other.

2. A shunt resistor comprising:

a first resistive body, and the first resistive body being rectangular;

two base materials sandwiching the first resistive body therebetween and joined to the first resistive body by welding, and the two base materials being rectangular;

a second resistive body joined to the two base materials by welding at a position different from the first resistive body, and the second resistive body being rectangular;

a third resistive body joined to the two base materials by welding at a position different from the first rectangular resistive body, and the third resistive body being rectangular;

a lower side surface of the second resistive body is joined to an upper side surfaces of the two base materials by welding so that an upper surface of the first resistive body and an upper surface of the second resistive body are flush with each other and the lower side surface of the second resistive body and an upper side surface of the first resistive body come in contact with each other, and an upper side surface of the third resistive body is joined to lower side surfaces of the two base materials by welding so that the upper surface of the first resistive body and the upper surface of the third resistive body are flush with each other and the upper side surface of the third resistive body and a lower side surface of the first resistive body come in contact with each other.

* * * * *